(12) United States Patent
Janarthanan et al.

(10) Patent No.: US 12,216,568 B2
(45) Date of Patent: Feb. 4, 2025

(54) SYSTEM AND METHOD FOR GENERATING TEST SCRIPTS

(71) Applicant: HCL TECHNOLOGIES LIMITED, New Delhi (IN)

(72) Inventors: Hariprasath Janarthanan, Chennai (IN); Nishar Ahamed, Chennai (IN); Yuvarajan Shanmugasundaram, Chennai (IN); SivaSakthivel Sadasivam, Chennai (IN); Rajesh Babu Suraparaju, Chennai (IN)

(73) Assignee: HCL TECHNOLOGIES LIMITED, New Delhi (IN)

( * ) Notice: Subject to any disclaimer, the term of this patent is extended or adjusted under 35 U.S.C. 154(b) by 496 days.

(21) Appl. No.: 17/205,174

(22) Filed: Mar. 18, 2021

(65) Prior Publication Data
US 2021/0294728 A1 Sep. 23, 2021

(30) Foreign Application Priority Data

Mar. 20, 2020 (IN) .............................. 202011012189

(51) Int. Cl.
G06F 11/36 (2006.01)
G01R 31/3183 (2006.01)

(52) U.S. Cl.
CPC .. *G06F 11/3684* (2013.01); *G01R 31/318307* (2013.01); *G06F 11/3688* (2013.01); *G06F 11/3692* (2013.01); *G06F 11/3696* (2013.01)

(58) Field of Classification Search
None
See application file for complete search history.

(56) References Cited

U.S. PATENT DOCUMENTS

| 8,799,714 B1* | 8/2014 | Guruswamy | G06F 11/3684 714/25 |
| 10,019,346 B2 | 7/2018 | Luan et al. | |
| 2005/0177816 A1* | 8/2005 | Kudukoli | G06F 8/34 717/136 |
| 2011/0191676 A1* | 8/2011 | Guttman | G06F 11/3414 715/768 |

(Continued)

FOREIGN PATENT DOCUMENTS

| CN | 105204992 A | 12/2015 |
| CN | 107665168 A | 2/2018 |
| KR | 20150048365 A | 5/2015 |

*Primary Examiner* — John W Miller
*Assistant Examiner* — Sean N. Haiem
(74) *Attorney, Agent, or Firm* — Kendal M. Sheets

(57) ABSTRACT

Disclosed is a method and system for generating test scripts. The method comprises receiving at least one of a video and/or an audio captured during manual testing of a Device Under Test (DUT) comprising an output unit or a Graphical User Interface (GUI) based application. At least one of the video and/or the audio is processed for generating a test script for the DUT or the GUI based application. Generation of the test script may include allowing a user to pause at least one of the video and/or the audio at a particular time frame. Using a script generator user interface, input events corresponding to the particular time frame are received. A type of validation is selected for the output unit of the DUT or the GUI based application, and inputs are provided for the validation. The validation is device specific and performed using during runtime test execution.

14 Claims, 3 Drawing Sheets

(56) References Cited

U.S. PATENT DOCUMENTS

| | | | | |
|---|---|---|---|---|
| 2014/0095931 | A1* | 4/2014 | Sadasivam | G06F 11/263 |
| | | | | 714/28 |
| 2014/0359566 | A1* | 12/2014 | Avadhanula | G06F 8/35 |
| | | | | 717/109 |
| 2016/0283353 | A1* | 9/2016 | Owen | G06F 11/3684 |
| 2017/0177466 | A1* | 6/2017 | Owen | G06F 11/3688 |
| 2017/0184698 | A1* | 6/2017 | Rueth | G09G 3/006 |
| 2019/0258953 | A1* | 8/2019 | Lang | G06N 3/08 |
| 2019/0347369 | A1* | 11/2019 | Ebstyne | G06V 10/774 |
| 2019/0347372 | A1* | 11/2019 | Ebstyne | G06F 11/3684 |
| 2022/0129148 | A1* | 4/2022 | Shang | G06F 3/04886 |

* cited by examiner

SYSTEM AND METHOD FOR GENERATING TEST SCRIPTS

CROSS-REFERENCE TO RELATED APPLICATIONS AND PRIORITY

The present application claims benefit from Indian patent application No. 202011012189 filed on 20 Mar. 2020 the entirety of which is hereby incorporated by reference.

TECHNICAL FIELD

The present subject matter described herein, in general, relates to generation of test scripts, and more particularly to generation of test scripts using audio/video of a Device Under Test (DUT) or a Graphical User Interface (GUI) based application.

BACKGROUND

Development of test script for automation testing of Graphical User Interface (GUI) based applications and display and non-display embedded devices using conventional techniques involve several challenges. A primary challenge includes lack of adequate knowledge for script developers in new environments. The script developers are required to learn the new environments for developing test scripts which becomes a time intensive task. Further, challenges are often faced in setting up of environment and configurations for hardware Devices Under Test (DUT) and software applications. Additionally, significant amount of time is required to understand the test cases from a document mentioning them. Further, hardware dependency is also required to be checked for determining feasibility of the test cases.

In light of the above stated problems, there remains a need for a system and a method that could generate test scripts for DUTs with least amount of manual intervention.

SUMMARY

Before the present systems and methods for generating test scripts are described, it is to be understood that this application is not limited to the particular systems, and methodologies described, as there can be multiple possible embodiments which are not expressly illustrated in the present disclosures. It is also to be understood that the terminology used in the description is for the purpose of describing the particular implementations or versions or embodiments only, and is not intended to limit the scope of the present application.

This summary is provided to introduce aspects related to a system and a method for generating test scripts). This summary is not intended to identify essential features of the claimed subject matter nor is it intended for use in determining or limiting the scope of the claimed subject matter.

In one implementation, a system for generating test scripts is disclosed. In one aspect, the system comprises a memory, and a processor coupled to the memory. Further, the processor may be capable of executing instructions in the memory to perform one or more steps described now. The processor may receive at least one of a video and/or an audio captured during manual testing of a Device Under Test (DUT) comprising an output unit or a Graphical User Interface (GUI) based application, wherein the output unit may provide at least one of an audio and/or a video output. At least one of the video and/or the audio may be processed for generating a test script for the DUT or the GUI based application. In order to generate the test script, a user may be allowed to pause at least one of the video and/or the audio at a particular time frame. Using a script generator user interface, input events corresponding to the particular time frame may be received. Finally, a type of validation may be selected for the output unit of the DUT or the GUI based application, and inputs may be provided for the validation. The validation may be device specific and performed using one of image comparison, video and audio comparison, character recognition, signal processing, data processing, during a runtime test execution of the DUT or the GUI based application.

In one implementation, a method for generating test scripts is disclosed. In one aspect, the method includes receiving at least one of a video and/or an audio captured during manual testing of a Device Under Test (DUT) comprising an output unit or a Graphical User Interface (GUI) based application. The output unit may provide at least one of an audio and/or a video output. The method further includes processing at least one of the video and/or the audio for generating a test script for the DUT or the GUI based application. In order to generate the test scripts, the method may include: allowing a user to pause at least one of the video and/or the audio at a particular time frame; receiving, using a script generator user interface, input events corresponding to the particular time frame; and selecting a type of validation for the output unit of the DUT or the GUI based application, and providing inputs for the validation. The validation may be device specific and performed using one of image comparison, video and audio comparison, character recognition, signal processing, data processing, during a runtime test execution of the DUT or the GUI based application.

BRIEF DESCRIPTION OF THE DRAWINGS

The foregoing detailed description of embodiments is better understood when read in conjunction with the appended drawings. For the purpose of illustrating of the present subject matter, an example of construction of the present subject matter is provided as figures; however, the invention is not limited to the specific method and system disclosed in the document and the figures.

The present subject matter is described in detail with reference to the accompanying figures. In the figures, the left-most digit(s) of a reference number identifies the figure in which the reference number first appears. The same numbers are used throughout the drawings to refer various features of the present subject matter.

DETAILED DESCRIPTION

Some embodiments of this disclosure, illustrating all its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise. Although any systems and methods for generating test scripts, similar or equivalent to those described herein can be used in the practice or testing of embodiments of the present disclosure, the exemplary, systems and methods for generating test scripts are now described. The disclosed embodiments for generating test scripts are merely examples of the disclosure, which may be embodied in various forms.

Various modifications to the embodiment will be readily apparent to those skilled in the art and the generic principles herein may be applied to other embodiments for generating test scripts. However, one of ordinary skill in the art will readily recognize that the present disclosure for generating test scripts is not intended to be limited to the embodiments described, but is to be accorded the widest scope consistent with the principles and features described herein.

Figure 1:
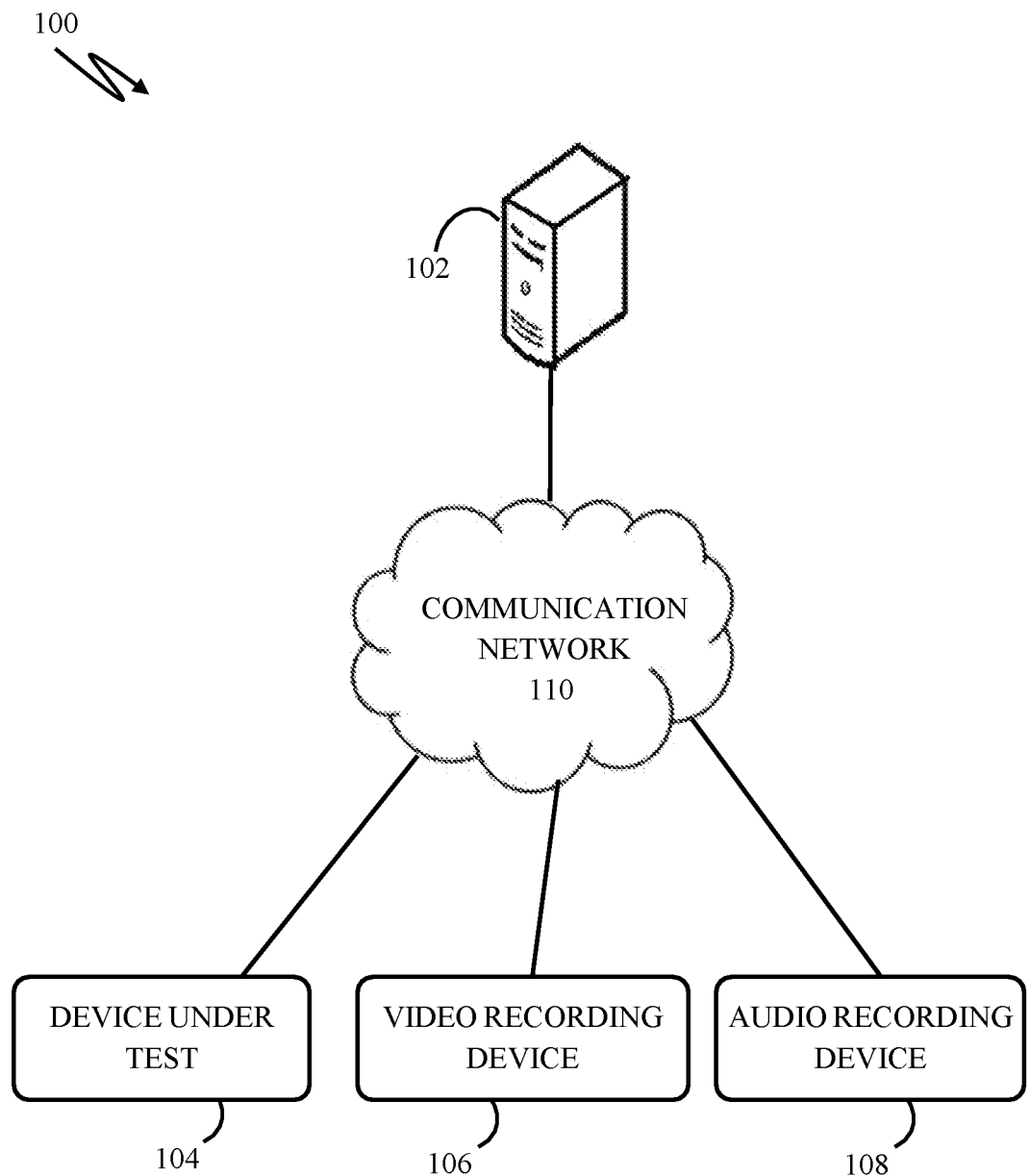
FIG. 1 illustrates a network architecture diagram 100 of a system 102 for generating test scripts, in accordance with an embodiment of the present subject matter.

Referring now to FIG. 1, a network implementation diagram 100 of a system 102 for generating test scripts, in accordance with an embodiment of the present subject matter may be described. In one example, the system 102 may be connected with a Device Under Test (DUT) 104, a video recording device 106, and an audio recording device 108, through a communication network 110.

It should be understood that the system 102 corresponds to a computing device. It may be understood that the system 102 may also be implemented in a variety of computing systems, such as a laptop computer, a desktop computer, a notebook, a workstation, a mainframe computer, a server, a network server, a cloud-based computing environment, or a mobile and the like.

In one implementation, the communication network 110 may be a wireless network, a wired network, or a combination thereof. The communication network 110 can be implemented as one of the different types of networks, such as intranet, Local Area Network (LAN), Wireless Personal Area Network (WPAN), Wireless Local Area Network (WLAN), wide area network (WAN), the internet, and the like. The communication network 110 may either be a dedicated network or a shared network. The shared network represents an association of the different types of networks that use a variety of protocols, for example, MQ Telemetry Transport (MQTT), Extensible Messaging and Presence Protocol (XMPP), Hypertext Transfer Protocol (HTTP), Transmission Control Protocol/Internet Protocol (TCP/IP), Wireless Application Protocol (WAP), and the like, to communicate with one another. Further, the communication network 110 may include a variety of network devices, including routers, bridges, servers, computing devices, storage devices, and the like. The communication network 110 may be organized as a peer to peer (P2P) network.

Figure 2:
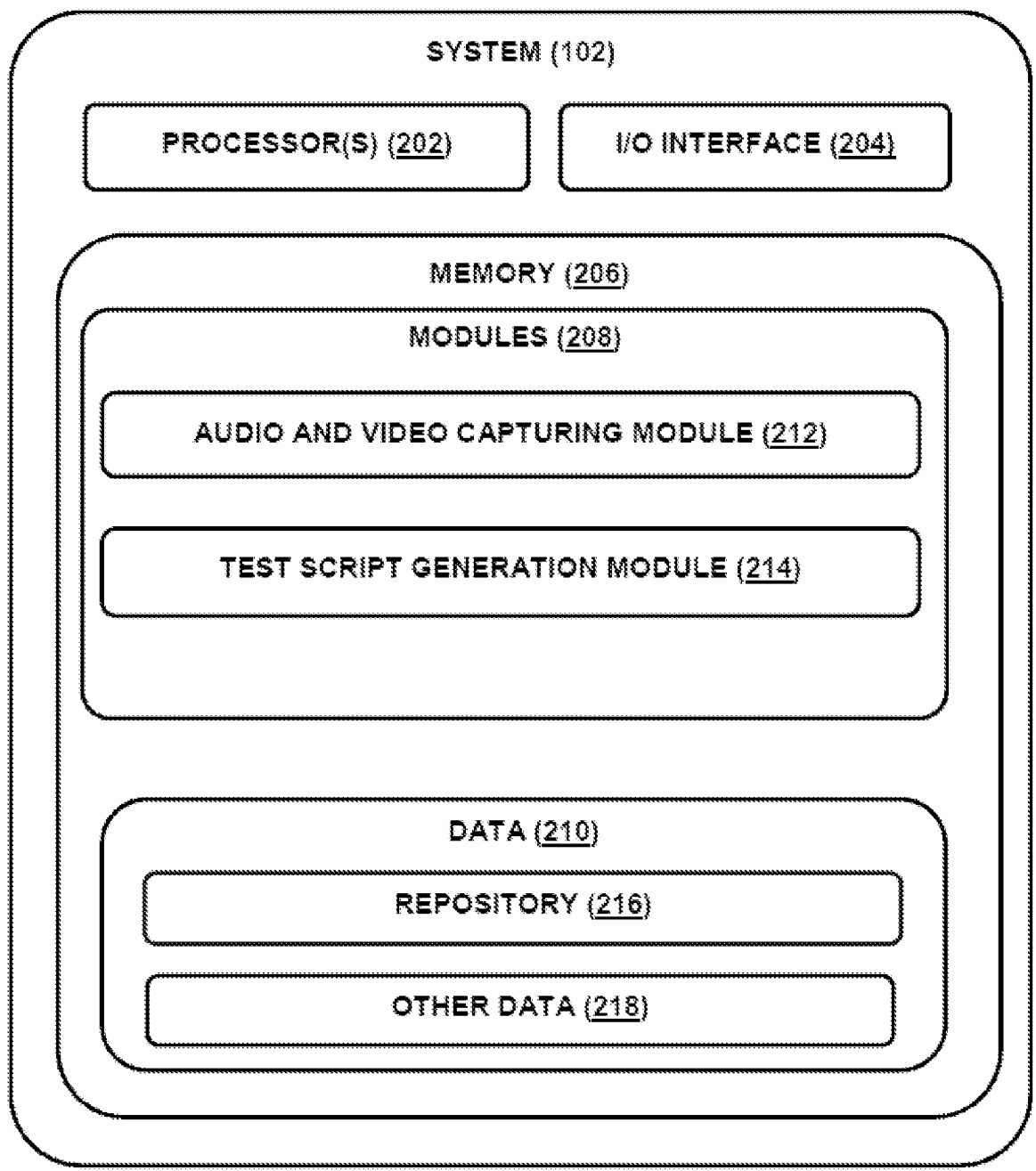
FIG. 2 illustrates a block level diagram of the system 102, in accordance with an embodiment of the present subject matter.

Referring now to FIG. 2, a block diagram 200 of the system 102 is illustrated in accordance with an embodiment of the present subject matter. In one embodiment, the system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 may be configured to fetch and execute computer-readable instructions stored in the memory 206.

The I/O interface 204 may include a variety of software and hardware interfaces, such as Robotic ARM, Video Capture Card, Data Acquisition (DAQ) device, Infrared (IR) Blaster, Key Board Mouse (KBM), etc. The hardware interface may include, for example, a web interface, a graphical user interface, a command line interface, and the like. The I/O interface 204 may allow a user to interact with the system 102. Further, the I/O interface 204 may enable the system 102 to communicate with the data sources 104, and other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server. The I/O interface 204 may enable to perform keyboard & mouse events, trigger IR commands, perform touch screen events, button press events, image capturing, signal processing, and data communication.

The memory 206, amongst other things, serves as a repository for storing data processed, received, and generated by one or more of modules 208. The memory 206 may include any computer-readable medium or computer program product known in the art including, for example, volatile memory, such as Static Random Access Memory (SRAM) and Dynamic Random Access Memory (DRAM), and/or non-volatile memory, such as Read Only Memory (ROM), Erasable Programmable ROM (EPROM), Electrically Erasable and Programmable ROM (EEPROM), flash memories, hard disks, optical disks, and magnetic tapes.

The memory 206 may include data generated as a result of the execution of one or more of the modules 208. In one implementation, the memory 206 may include data 210. The modules 208 include routines, programs, objects, components, data structures, etc., which perform particular tasks or implement particular abstract data types. In one implementation, the modules 208 may include an audio and video capturing module 212 and a test script generation module 214. The modules 208 described herein may be implemented as software modules that may be executed in the cloud-based computing environment of the system 102.

The data 210 may include a repository 216 for storing data processed, computed, received, and generated by one or more of the modules 208. Furthermore, the data 210 may include other data 218 for storing data generated as a result of the execution of modules than the ones mentioned above.

In one implementation, to test a Device Under Test (DUT) 104, at first, a video and/or an audio may be captured during manual testing of the DUT 104 comprising an output unit. It should be understood that the DUT 104 may correspond to a display or non-display embedded device or a Graphical User Interface (GUI) based application. The video and/or audio may be captured using the video recording device 106 and/or the audio recording device 108. The output unit of the DUT 104 may be capable of providing output in form of a Light Emitting Diode (LED) glow, an image, a video signal, an audio signal, a digital or analog signal, data, and a waveform. The output unit may be a signal oscilloscope, a communication device, or a Digital to Analog Converter (DAC). The DUT 104 may be a smartphone, smartwatch, fitness band, desktop, laptop, gaming console, biomedical equipment, office automation devices such as printers and scanners, home automation devices such as refrigerator and washing Machine, industrial devices, automotive, telecommunication devices, aeronautical devices, software applications, and the like.

The video and/or the audio may be received by the system 102 for processing. The processing may be performed for generating a test script for the DUT 104. In order to generate the test script, at least one of the video and/or the audio may be paused at a particular time frame, based on a user's input. Using a script generator user interface, input events corresponding to the particular image frame may be received from the user.

In one embodiment, the input events may be provided using input devices comprising Graphical User Input (GUI) controlling input devices. The GUI controlling input devices may include a Keyboard Mouse (KBM), a robotic arm, and a voice command producing device. The input events may also be provided using input devices comprising signal level input devices. The signal level input devices may include a Data Acquisition Card (DAC) and a function generator. The input events may comprise touch events, keyboard & mouse simulation, button Press, triggering of analog and/or digital signals, remote control commands, or any other communication protocol.

Finally, a type of validation may be selected for the output unit of the DUT 104, and inputs may be provided for the validation. The validation may be device specific and performed using one of image comparison, video and audio comparison, character recognition, signal processing, data processing, during a runtime test execution of the DUT or the GUI based application. Further, outputs obtained by processing of the inputs may be validated based on real-time scenario using intrusive testing from devices. This would allow verification of run-time dynamic data too.

Similar to the above mentioned process, each frame of the video and/or the audio may be processed for generating test cases. The test script may be generated in a programming language selected by the user. Further, the test script may be generated for both intrusive and non-intrusive based device testing. The test script may be generated using configured parameters and reference images on a specified frame of the video.

Therefore, in the above described manner, test scripts may be generated by processing at least one of videos and/or audios captured during manual testing of DUT's or Graphical User Interface (GUI) based applications, and the DUT's and the GUI based applications may be automatically tested, without requiring manual intervention.

Figure 3:
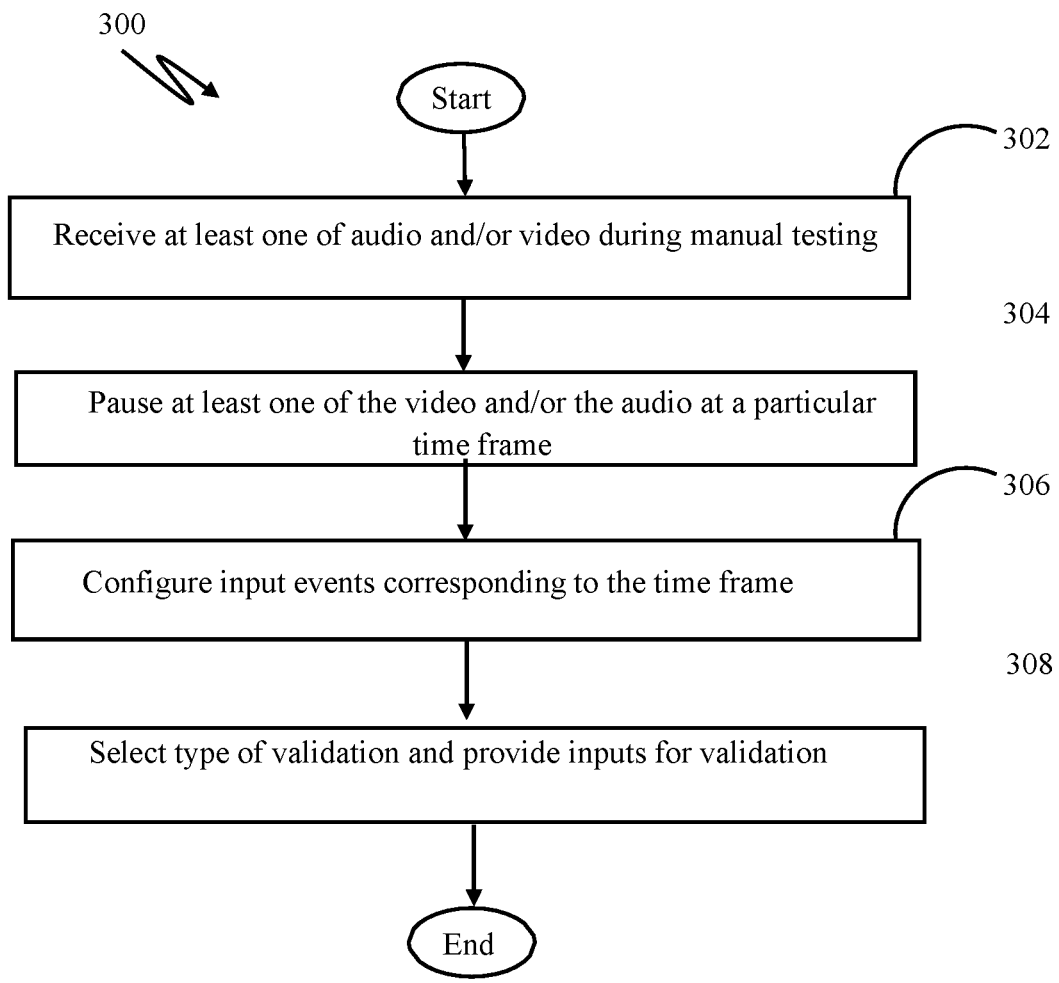
FIG. 3 illustrates a method 300 for generating test scripts, in accordance with an embodiment of the present subject matter.

Referring now to FIG. 3, a method 300 for generating test scripts is described, in accordance with an embodiment of the present subject matter. The method 300 may be described in the general context of computer executable instructions. Generally, computer executable instructions can include routines, programs, objects, components, data structures, procedures, modules, functions, etc., that perform particular functions or implement particular abstract data types.

The order in which the method 300 for generating test scripts is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method can be implemented in any suitable hardware, software, firmware, or a combination thereof. However, for ease of explanation, in the embodiments described below, the method 300 may be considered to be implemented in the above described system 102.

At block 302, at least one of a video and/or an audio may be captured during manual testing of a Device Under Test (DUT) comprising an output unit or a Graphical User Interface (GUI) based application. The output unit may provide at least one of an audio and/or a video output.

At block 304, at least one of the video and/or the audio may be paused at a particular time frame based on a user's input.

At block 306, input events corresponding to the particular time frame may be received to configure inputs corresponding to the time frame. Such input events may be received using a script generator user interface.

At block 308, a type of validation may be selected for the output unit of the DUT or the GUI based application, and inputs may be provided for the validation. The validation may be device specific and performed using one of image comparison, video and audio comparison, character recognition, signal processing, data processing, during a runtime test execution of the DUT or the GUI based application.

Although implementations for methods and systems for generating test scripts have been described in language specific to structural features and/or methods, it is to be understood that the appended claims are not necessarily limited to the specific features or methods described. Rather, the specific features and methods are disclosed as examples of implementations for generating test scripts.

The invention claimed is:

1. A method for generating test scripts, the method comprising:
   receiving at least one of a video and/or an audio captured during manual testing of a Device Under Test (DUT) comprising an output unit or a Graphical User Interface (GUI) based application, wherein the output unit may provide at least one of an audio and/or a video output; and
   processing at least one of the video and/or the audio for generating a test script, for the DUT or the GUI based application by:
      allowing a user to pause at least one of the video and/or the audio at a particular time frame;
      receiving, using a script generator user interface, input events corresponding to the particular time frame; and
      selecting a type of validation for the output unit of the DUT or the GUI based application, and providing inputs for the validation, wherein the validation is device specific and performed using one of image comparison, video and audio comparison, character recognition, signal processing, data processing, during a runtime test execution of the DUT or the GUI based application; and
      validating outputs obtained by processing the inputs based on real-time scenarios using intrusive testing from devices, allowing verification of run-time dynamic data;
   generating test scripts for both intrusive and non-intrusive based device testing.

2. The method as claimed in claim 1, wherein the test script is generated in a programming language selected by a user.

3. The method as claimed in claim 1, wherein the test script is generated using configured parameters and reference images on a specified frame of the video.

4. The method as claimed in claim 1, wherein test scripts are generated for all image frames of the video.

5. The method as claimed in claim 1, wherein the input events are provided using input devices comprising Graphical User Input (GUI) controlling input devices, and wherein the GUI controlling input devices include a Keyboard Mouse (KBM), a robotic arm, and a voice command producing device.

6. The method as claimed in claim 1, wherein the input events are provided using input devices comprising signal level input devices, and wherein the signal level input devices include a Data Acquisition Card (DAC) and a function generator.

7. The method as claimed in claim 1, wherein the output unit provides an output in form of Light Emitting Diode (LED) glow, a video signal, an audio signal, and a waveform.

8. A system for generating test scripts, the system comprising:
a memory; and
a processor coupled to the memory, wherein the processor is capable of executing instructions to perform steps of:
receiving at least one of a video and/or an audio captured during manual testing of a Device Under Test (DUT) comprising an output unit or a Graphical User Interface (GUI) based application, wherein the output unit may provide at least one of an audio and/or a video output; and
processing at least one of the video and/or the audio for generating a test script for the DUT or the GUI based application by:
allowing a user to pause at least one of the video and/or the audio at a particular time frame;
receiving, using a script generator user interface, input events corresponding to the particular time frame; and
selecting a type of validation for the output unit of the DUT or the GUI based application, and providing inputs for the validation wherein the validation is device specific and performed using one of image comparison, video and audio comparison, character recognition, signal processing, data processing, during a runtime test execution of the DUT or the GUI based application; and
validating outputs obtained by processing the inputs based on real-time scenarios using intrusive testing from devices, allowing verification of run-time dynamic data;
generating test scripts for both intrusive and non-intrusive based device testing.

9. The system as claimed in claim 8, wherein the test script is generated in a programming language selected by a user.

10. The system as claimed in claim 8, wherein the test script is generated using configured parameters and reference images on a specified frame of the video.

11. The system as claimed in claim 8, wherein test scripts are generated for other image frames of the video.

12. The system as claimed in claim 8, wherein the input events are provided using input devices comprising Graphical User Input (GUI) controlling input devices, and wherein the GUI controlling input devices include a Keyboard Mouse (KBM), a robotic arm, and a voice command producing device.

13. The system as claimed in claim 8, wherein the input events are provided using input devices comprising signal level input devices, and wherein the signal level input devices include a Data Acquisition Card (DAC) and a function generator.

14. The system as claimed in claim 8, wherein the output unit provides an output in form of Light Emitting Diode (LED) glow, a video signal, an audio signal, and a waveform.

* * * * *